United States Patent [19]

Ellis et al.

[11] Patent Number: 4,602,980
[45] Date of Patent: Jul. 29, 1986

[54] METHOD FOR IMPROVING CRYSTALLINITY OF SEMICONDUCTOR RIBBON

[75] Inventors: Ralph J. Ellis, Mesa; Ronald N. Legge, Scottsdale; Israel A. Lesk, Phoenix, all of Ariz.

[73] Assignee: Solavolt International, Houston, Tex.

[21] Appl. No.: 656,390

[22] Filed: Oct. 1, 1984

[51] Int. Cl.⁴ ............................................. C30B 13/24
[52] U.S. Cl. ............................................. 156/617 R
[58] Field of Search ............... 156/61.7 R, DIG. 88, 156/DIG. 102, DIG. 80

[56] References Cited

U.S. PATENT DOCUMENTS

| 4,199,397 | 4/1980 | Gurtler | 156/617 R |
| 4,406,709 | 9/1983 | Celler et al. | 156/617 R |
| 4,510,015 | 4/1985 | Ellis et al. | 156/617 R |

OTHER PUBLICATIONS

Baghdadi et al, Jl. of Crystal Growth 50, 1980, pp. 236-246.

*Primary Examiner*—Hiram H. Bernstein
*Attorney, Agent, or Firm*—John A. Fisher

[57] ABSTRACT

A method is disclosed for improving the crystallinity of semiconductor ribbon material while increasing the material throughput and decreasing energy requirements. The crystallinity of a ribbon of semiconductor material can be improved by forming a localized molten zone in the material and sweeping this molten zone along the length of the material. As the molten zone refreezes, the material is locally recrystallized with enhanced grain size. In accordance with the invention, two ribbons are positioned back-to-back with a slight spacing between the ribbons. Energy sources are focused on the outer surfaces of the two ribbons to create a molten zone in each of the ribbons. Because of the close proximity between the ribbons, much of the energy reradiated from each molten zone is absorbed by the adjacent ribbon. The molten zones are then swept along both of the ribbons to simultaneously cause crystal improvement in both ribbons. The total energy input required for recrystallizing two ribbons is only slightly greater than the energy required to recrystallize one ribbon. Further improvements in the process are achieved by positioning a thermal diffuser between the two ribbons and/or staggering the relative positions of the molten zones.

16 Claims, 5 Drawing Figures

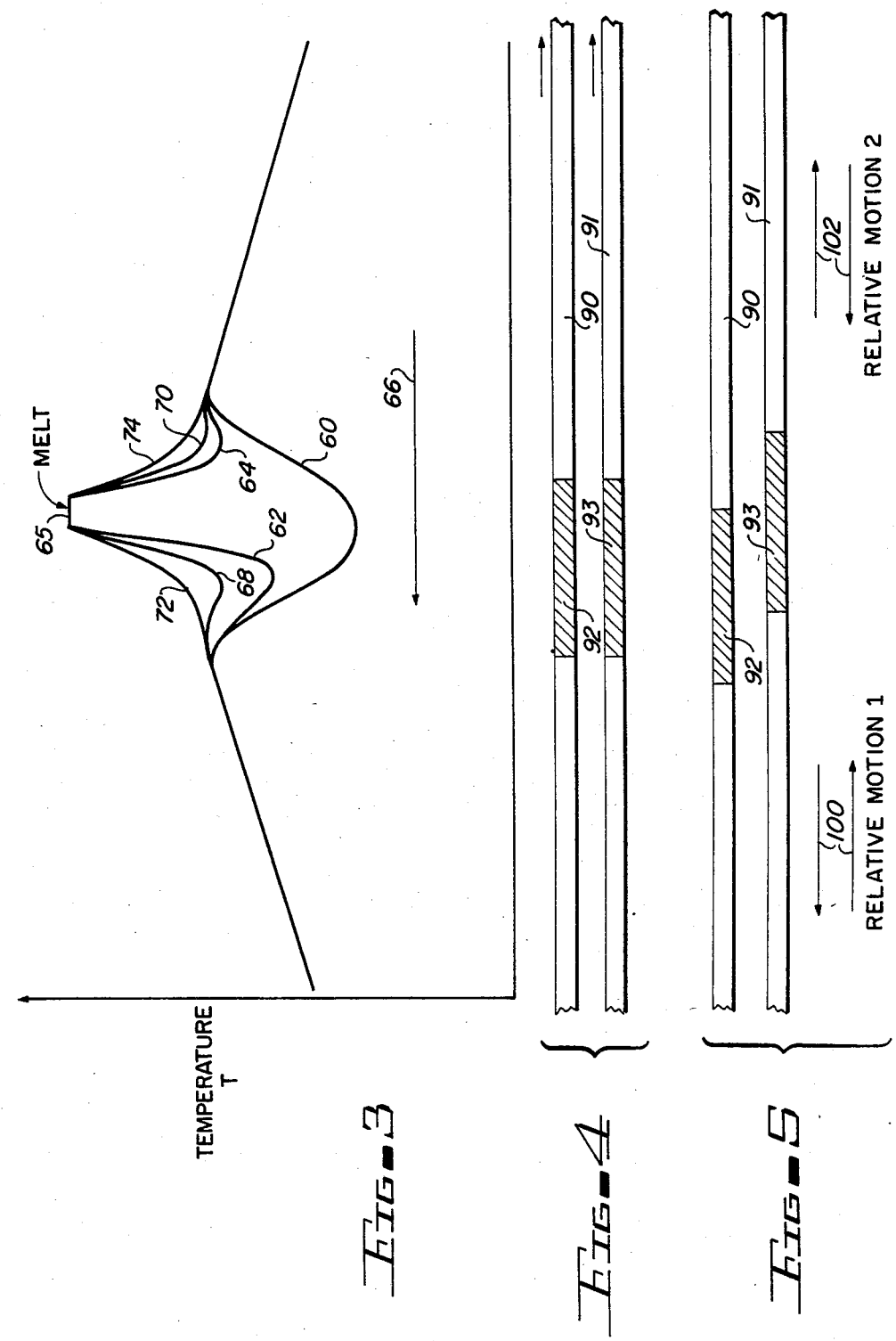

METHOD FOR IMPROVING CRYSTALLINITY OF SEMICONDUCTOR RIBBON

BACKGROUND OF THE INVENTION

This invention relates generally to a method for improving the crystallinity of semiconductor ribbons, and more specifically to a method for simultaneously recrystallizing a plurality of semiconductor ribbons.

In the manufacture of semiconductor devices such as transistors, integrated circuits, photovoltaic devices and the like, the semiconductor industry uses large quantities of semiconductor material, usually silicon, in the form of thin wafers or sheets. It has been conventional to produce the semiconductor wafers by first growing a single crystal semiconductor ingot, sawing the ingot into a plurality of thin slices, and then lapping and polishing the slices to the desired thickness and surface finish. Although this process has proved satisfactory for most semiconductor devices, it is too expensive for some large area semiconductor devices and especially for large area photovoltaic devices or solar cells. In fact, in order that photovoltaic devices become a viable alternate energy source, a significant reduction in the cost of the semiconductor starting material is essential.

One technique which has been proposed and developed for the production of thin sheets of semiconductor material suitable for the production of solar cells is the so-called ribbon-to-ribbon (RTR) conversion process. In this process a polycrystalline ribbon is transformed directly into a macrocrystalline ribbon without the need for costly processing of large diameter ingots. The RTR process uses one or more scanned beams of energy impinging upon one or both sides of a polycrystalline ribbon to locally melt the ribbon and to induce crystal growth as the ribbon is translated past the energy beam. As the molten zone moves along the ribbon, the material behind the zone resolidifies in a macrocrystalline form. The macrocrystalline structure is one in which the crystals are oi suifficiently large size to permit efficient semiconductor action. Therefore, a monocrystalline ribbon wherein the ribbon is but a single crystal is encompassed within the term "macrocrystalline." In this context the word "ribbon" generally implies an elongate strip or sheet having a width much greater than its thickness. Typical dimension are a length of 15-30 centimeters, a width of 1-10 centimeters and a thickness of 50-250 micrometers.

The RTR conversion technique has proved successful in producing semiconductor substrates at a reduced cost for use in fabricating photovoltaic devices. It is desirable, however, to even further reduce the cost of the conversion process, for example, by reducing the amount of energy required to accomplish the melting. It is further desirable to alter the thermal profiles experienced by the ribbon during conversion to thereby improve the quality of the converted material.

It is therefore an object of this invention to provide an improved process for the conversion of polycrystalline material to macrocrystalline material.

It is another object of this invention to provide an improved RTR process having an increased throughput and a reduced energy cost.

It is a still further object of this invention to provide an improved RTR process for producing silicon ribbons of improved crystal quality.

BRIEF SUMMARY OF THE INVENTION

The foregoing and other objects and advantages of the invention are achieved through the use of a process in which two ribbons in back-to-back, spaced apart relationship are simultaneously RTR processed. The radiant energy from two energy sources, such as lasers, are directed onto the exposed major surfaces of the two ribbons to locally heat each of the ribbons and to form a molten region in each. Relative motion between the two ribbons and the energy sources causes the molten zones to be swept along the length of the ribbons. As the molten zones freeze, the material recrystallizes with enhanced grain size. Because most of the power lost from the melt zone of the recrystallizing ribbons is by radiation, by converting two ribbons in the manner contemplated by the invention, the number of surfaces radiating and losing power is reduced with a corresponding reduction in the amount of laser power per ribbon required for recrystallization.

BRIEF DESCRIPTION OF THE DRAWINGS

FIG. 3 illustrates temperature profiles encountered by ribbons during the ribbon-to-ribbon recrystallization; and FIGS. 4 and 5 schematically illustrate positioning of melt regions in two ribbons recrystallized in accordance with the invention.

DETAILED DESCRIPTION OF PREFERRED EMBODIMENTS

Figure 1:
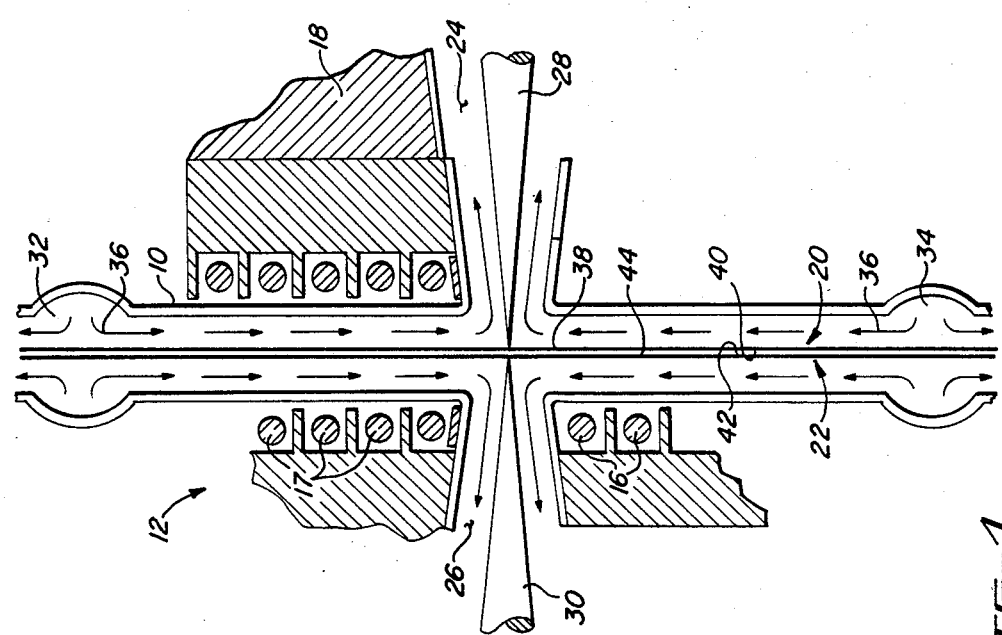

FIG. 1 schematically illustrates apparatus for practicing the ribbon-to-ribbon (RTR) conversion process in accordance with the invention. The process is generally applicable to the conversion of a number of different semiconductor materials, but is particularly applicable to the conversion of polycrystalline silicon ribbon to macrocrystalline silicon ribbon having an enhanced grain size.

The RTR conversion apparatus and ribbons are shown in cross section in FIG. 1. The apparatus includes an envelope 10 such as a quartz jacket within which the processing ambient can be controlled. The envelope is positioned within a furnace 12 including preheater elements 16, postheater elements 17, and insulation 18. The furnace provides preheating and postheating as ribbons 20, 22 pass through the furnace and are processed. Openings 24, 26 are provided in opposite sides of furnace 12 to provide "windows" through which incident energy can be focused onto the broad surfaces of the ribbons. Beams of energy 28, 30 from sources (not shown) are focused onto each of the ribbons. In the prior art structure wherein a single ribbon was processed through a similar apparatus, two beams of energy were focused onto the opposite sides of the same ribbon. Here, in accordance with the invention, two energy sources are used, but two ribbons instead of one are processed simultaneously. The beams of energy can be, for example, laser, electron beam, ion beam, focused incandescent, or the like. For purposes of illustration only, the energy source will be described as a laser.

Preheated purging gases are introduced to the envelope 10 at, for example, locations 32, 34. The preheated purging gases, which can be, for example, nitrogen, argon, or the like, flow both upwardly and downwardly from the locations 32, 34, passing out of the envelope at both the ends of the envelope and at the windows 24, 26. The purging gases provide a controlled ambient for the processing of the ribbon even though envelope 10 is not completely sealed. The purging gases flow through the apparatus as indicated by arrows 36.

In accordance with the invention, two ribbons 20, 22 are processed simultaneously in the apparatus as indicated in FIG. 1. The two ribbons, shown here in side view, are held in spaced apart relationship with the broad surfaces of the ribbons back-to-back. Energy beams 28, 30 are directed to impinge on the outwardly facing broad surfaces of the ribbons to form molten zones in each ribbon. Radiation reemitted from the molten zone in ribbon 20, for example, is divided into two portions. One portion radiates from surface 38 and is lost; the second portion radiates from surface 40 and impinges on the closely adjacent surface 42 of ribbon 22. Similarly, a portion of the energy radiated from the molten zone in ribbon 22 is lost, while a second portion impinges upon ribbon 20 and adds to the heating of that ribbon. Approximately half of the energy which is normally lost by radiation from the molten zones is, therefore, retained by the adjacent ribbon.

The spacing between the ribbons is ideally held to a minimum. Because of bulging of the molten zone as well as irregularities in the surface of the ribbons, a spacing of about 0.1 millimeter is a practical lower limit. Preferably the spacing between the ribbons does not exceed about 0.2-0.3 millimeters to ensure efficient coupling of the energy between the ribbons. The spacing can be effected by placing spacers of quartz or similar material between the ribbons.

In carrying out the ribbon-to-ribbon conversion method, two ribbons are translated past the sources of impinging radiant energy. The radiant energy causes the melting of the ribbons in a localized region and the translation of the ribbons past the heat source causes the localized molten zone to be swept along the length of the ribbons. If the ribbons are translated upwardly in FIG. 1, for example, the lower bank of heaters 16 act as preheaters raising the temperature of the ribbons to a temperature near the melting point of the semiconductor material. The upper bank of heaters 17 then functions as a postheater which properly anneals the resolidified and now improved semiconductor material. The thermal profile through the apparatus is explained more fully below.

Figure 2:
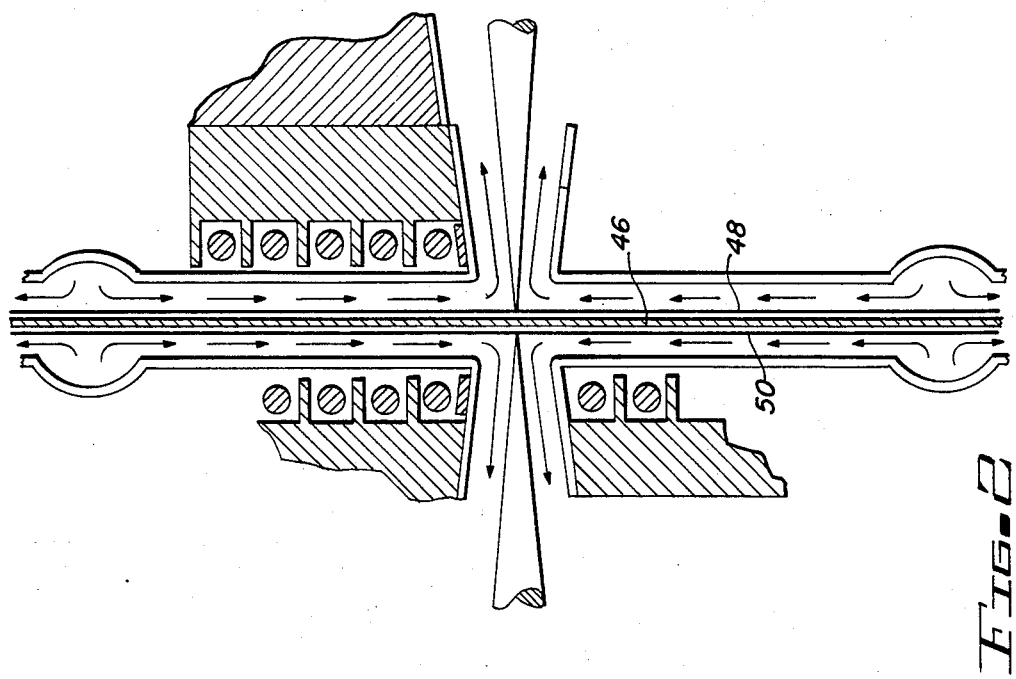
FIGS. 1 and 2 illustrate apparatus for converting semiconductor ribbons in accordance with two embodiments of the invention.

FIG. 2 illustrates a further embodiment of the invention. The apparatus used in carrying out this embodiment of the invention is substantially similar to that illustrated in FIG. 1. In this embodiment a thermal diffuser 46 is positioned between two ribbons 48, 50. The thermal diffuser is a thin sheet or ribbon of material having a width equal to or greater than the width of the molten zone formed in the two ribbons. The diffuser material is refractory at the temperature of the molten semiconductor material. In the case of silicon ribbons, for example, the diffuser must be able to withstand temperatures up to about 1400° C. The material should further be non-contaminating since it will be in close proximity to the molten silicon and must not act as a dopant or contaminant. The diffuser should be thin enough to accommodate thermal coupling between the two ribbons. The diffuser can be, for example, of the same order of magnitude of thickness as are the ribbons themselves. The spacing between the diffuser and the ribbons should be kept to a minimum and is preferably less than about 0.2-0.3 millimeter to ensure good coupling of the energy from each ribbon through the diffuser to the opposite ribbon. The thermal diffuser can be graphite, silicon carbide, silicon, or the like, or a combination of such materials as silicon carbide coated graphite.

The role of the thermal diffuser is to minimize nonlinearities in the thermal gradient which the ribbon experiences during conversion. These nonlinearities are known to cause defect generation and a resultant reduction in solar cell performance. In addition, because the thermal diffuser is exposed to considerable radiation from the molten zones of each ribbon, proper choice of the thermal diffuser material results in this incident energy being thermally reemitted back onto the growing ribbons, thus reducing the required laser power for crystal growth.

The thermal diffuser can also act as a beam stop between ribbons in the event of ribbon breakage or punch through. During processing of the ribbons, a crack or thinned region in one of the ribbons can cause an opening in the ribbon through which the incident beam of energy can pass so that two beams are directly heating the remaining ribbon. Such unprogrammed direct heating of a single ribbon by the two beams disrupts the RTR process, interferes with grain enhancement, and can cause damage to the process equipment. The use of a thermal diffuser which can withstand thermal shock alleviates this problem since the errant beam now strikes the thermal diffuser and not the opposing ribbon.

The use of a thermal diffuser further allows the equalization of melt temperature across a growing ribbon where otherwise the center of the molten zone would be at a higher temperature. The equalization of melt temperature results from varying the thermal conduction properties of the diffuser across its width, for example by varying the thickness of the thermal diffuser. Equalizing the melt temperature across the ribbon results in better thickness uniformity and control of the resultant macrocrystalline ribbon.

By extending the thermal diffuser past the ends of the two ribbons undergoing RTR recrystallization, the starting and stopping thermal transients are reduced in intensity, thus reducing stresses in the initial and final regions of the ribbons. The thermal transients are reduced, for example, by controllably reducing power to the energy beams before melt zone establishment and after melt zone freezing and at the same time coupling energy into the thermal diffuser.

FIG. 3 illustrates temperature profiles experienced by a ribbon passing through the conversion apparatus. For all of these curves the growth direction relative to the front end of the ribbon is indicated by arrow 66. The melt temperature is indicated by the temperature region 65. Curve 60 illustrates the temperature profile produced by the preheat and postheat furnaces alone, without any incident beam energy. The dip in the temperature profile results from the gap between the preheaters and postheaters and is made as narrow as possible by bringing the preheaters and postheaters as close together as possible. Curves 62, 64 illustrate the temperature profile experienced by a single ribbon being processed through the RTR process. The dips in curve 62, 64 result from the limitations in bringing the preheating and postheating furnaces close to the incident beam melted region. The severity of the temperature dip at the growing interface is reduced by offsetting the melt to the right or toward the postheaters. Reduction of the thermal gradient on the growing side of the melt reduces the ultimate RTR growth speed capability, but improves the quality of the ribbon achieved. Curves 68, 70 illustrate the improved thermal profile realized when two ribbons are processed simultaneously in back-to-back fashion in accordance with the invention; the thermal dips on both the melting and growing directions are reduced. Curves 68, 70 represent the profile with the melt offset in similar fashion to that for the curves 62, 64. With RTR conversion in accordance with the invention, the reduction in temperature dip permits bringing the melt back to the center of symmetry of the thermal profiles (not shown).

FIG. 4 illustrates, in cross section, a portion of two ribbons 90, 91 during RTR conversion in accordance with the invention. The advantages of this configuration with two ribbons positioned back-to-back are that the required radiant energy is reduced by almost 50% since energy emitted from facing ribbon surfaces is trapped and not lost, and as explained above, the close proximity of the two melt zones 92, 93 results in a softening of the thermal profiles on both sides of the melts. The molten zones in FIG. 4 are shown to be in alignment with each other as would occur if the two radiant sources were aligned and the two ribbons were being moved together in the direction shown by arrows 95.

In accordance with a further embodiment of the invention, as illustrated in FIG. 5, the two melt zones 92, 93 can be displaced so that they are not aligned. If the two ribbons 90, 91 are moved in the same direction, and the displaced molten zones are achieved by displacing the beam energy sources, the near-melt thermal profiles experienced by the two ribbons will be different. The benefit to at least one of the ribbons, in terms of improved thermal profile is sufficient to justify such a process. If, however, the two ribbons are moved in opposite directions, and the melts are placed symmetrically between the profiling furnaces, each ribbon will experience the same thermal history. Relative motion can be in either of two senses as indicated by the arrows, 100 and 102. Relative motion 100 softens the melting-side profile and sharpens the freezing-side profile for both ribbons; relative motion 102 does the opposite.

Returning to FIG. 3, the curves 72, 64 indicate the thermal profile encountered by two ribbons having melt zones displaced as in FIG. 5, with relative motion 100 between the ribbons and with the melt zones symmetrical with respect to the preheat and postheat furnaces. Similarly, curves 62, 74 illustrates the thermal profile experienced by two ribbons as in FIG. 5, with relative motion 102 and the melt symmetrically positioned with respect to the preheat and postheat furnaces.

The degree of melt displacement and the spacing between profile furnaces can thus be used in determining the detailed temperature profile shapes. Flexibility of the staggered melt concept allows for a change in melt displacement for attaining preferred thermal gradients during selected parts of an RTR recrystallization cycle, and especially at the initiation and end of growth where conditions are affected by the ends of the polysilicon ribbons.

Thus it is apparent that there has been provided, in accordance with the invention, an improved method for the recrystallization and grain enhancement of semiconductor ribbons and sheets which fully meets the objects and advantages set forth above. While the invention has been described and illustrated by reference to specific embodiments thereof, it is not intended that the invention be so limited. Those skilled in the art will realize that many variations and modifications are possible which depart from the illustrative embodiments but which still fall within the spirit of the invention. For example, the invention has been specifically illustrated with reference to polycrystalline silicon ribbons, but is equally applicable to many other semiconductor materials in sheet or ribbon form. Further, specific reference has been made to localize heating of the silicon ribbon by an impinging laser beam, but it is intended that other forms of energy can be used, including hybrid sources such as a laser beam in combination with a focused incandescent light source. Further the invention is not limited to a method in which the semiconductor ribbons are moved with respect to fixed location energy sources. The furnace and energy sources, for example, could be moved relative to fixed semiconductor ribbons. Accordingly, it is intended to include all such variations and modifications as fall within the spirit and scope of the appended claims.

We claim:

1. A process for improving the crystallinity of semiconductor ribbon material which comprises the steps of: providing two semiconductor ribbons, each having first and second major surfaces; positioning said ribbons with said first major surfaces in spaced apart, back-to-back relationship; providing two energy sources; directing energy from said two energy sources to impinge on said second major surfaces of said two ribbons to locally heat said ribbons and to form a molten region in each of said ribbons; and causing relative motion between said ribbons and said energy sources to cause said molten zones to move along said ribbons.

2. The process of claim 1 wherein said energy sources are selected from lasers, electron beam sources, ion beam sources, focused incandescent sources and combinations thereof.

3. The process of claim 1 wherein said molten regions in said two ribbons are displaced one from the other.

4. The process of claim 1 further comprising the step of providing an inert ambient surrounding said ribbons.

5. The process of claim 1 further comprising the step of providing preheaters and postheaters positioned to heat said ribbons proximate said molten region.

6. The process of claim 5 wherein said energy sources impinge on said ribbons assymmetrically with respect to said preheaters and said postheaters.

7. The process of claim 1 wherein said two ribbons are spaced apart by a distance of less than about 0.3 mm.

8. The process of claim 1 wherein said molten regions are aligned with each other.

9. A process for improving the crystallinity of semiconductor material by localized melting and recrystallization of said material which comprises the steps of: providing semiconductor material in elongate ribbon form; positioning two of said ribbons in spaced apart, back-to-back relationship; interposing a thermal diffuser between said ribbons; providing first and second energy sources; directing energy from said first and second energy sources onto localized regions of said ribbons to form molten zones in each; and moving said ribbons to cause said molten zones to move therealong.

10. The process of claim 9 wherein said thermal diffuser comprises graphite, silicon carbide, silicon, or combinations thereof.

11. The process of claim 9 wherein said energy sources are selected from laser, electron beam source, ion beam source, incandescent source, and combinations thereof.

12. A process for improving the crystallinity of semiconductor material by localized melting and recrystallization of said material which comprises the steps of: providing two elongate semiconductor ribbons; positioning said ribbons in spaced apart back-to-back relationship; providing two energy sources; directing energy from a first of said energy sources onto a localized portion of a surface of one of said two ribbons to form a first molten region therein; directing energy from a second of said energy sources onto a localized portion of a surface of the other of said two ribbons to form a second molten region therein, moving said ribbons relative to said energy sources and relative to each other to cause said molten regions to move along said ribbons.

13. The process of claim 12 wherein said first and second molten regions are displaced from each other.

14. The process of claim 12 further comprising the step of interposing a thermal diffuser between said two ribbons.

15. The process of claim 12 wherein said two ribbons are moving in opposite directions.

16. The process of claim 12 wherein said energy sources are stationary and said ribbons are moved relative to said energy sources.

* * * * *